United States Patent
Kobayashi

(10) Patent No.: US 7,642,174 B2
(45) Date of Patent: Jan. 5, 2010

(54) LASER BEAM MACHINING METHOD FOR WAFER

(75) Inventor: Satoshi Kobayashi, Ota-Ku (JP)

(73) Assignee: Disco Corporation, Tokyo (JP)

( * ) Notice: Subject to any disclaimer, the term of this patent is extended or adjusted under 35 U.S.C. 154(b) by 78 days.

(21) Appl. No.: 12/138,623

(22) Filed: Jun. 13, 2008

(65) Prior Publication Data
US 2009/0004828 A1 Jan. 1, 2009

(30) Foreign Application Priority Data
Jun. 27, 2007 (JP) .............................. 2007-168933

(51) Int. Cl.
*H01L 21/00* (2006.01)
(52) U.S. Cl. .............................. 438/463; 257/E21.599; 257/E21.602
(58) Field of Classification Search .................. 438/463; 257/E21.599, E21.602
See application file for complete search history.

(56) References Cited

U.S. PATENT DOCUMENTS

| | | | | |
|---|---|---|---|---|
| 6,653,210 B2 * | 11/2003 | Choo et al. | .................. | 438/460 |
| 7,211,526 B2 * | 5/2007 | Iri et al. | ...................... | 438/797 |
| 7,396,742 B2 * | 7/2008 | Fukuyo et al. | .............. | 438/463 |
| 7,498,238 B2 * | 3/2009 | Tamura | ....................... | 438/463 |
| 7,507,639 B2 * | 3/2009 | Nakamura | ................... | 438/463 |
| 7,544,588 B2 * | 6/2009 | Genda | ......................... | 438/462 |
| 7,550,367 B2 * | 6/2009 | Tamura et al. | ............... | 438/463 |
| 7,592,238 B2 * | 9/2009 | Fukuyo et al. | .............. | 438/463 |

FOREIGN PATENT DOCUMENTS

JP A 2002-205180 7/2002
JP A 2006-108459 4/2006

* cited by examiner

*Primary Examiner*—Evan Pert
(74) *Attorney, Agent, or Firm*—Greer, Burns & Crain, Ltd.

(57) ABSTRACT

A laser beam machining method for a wafer, wherein an operation of irradiating the inside of a wafer with a laser beam L along each of planned dividing lines is repeated a plural number of times from a position proximate to a back-side surface of the wafer toward a face-side surface of the wafer so that a plurality of composite layers each including a denatured layer and a cracked layer extending from the denatured layer toward the face-side surface are formed stepwise at intervals (first laser beam irradiation step). Subsequently, each of some of non-cracked layers between the composite layers is irradiated with the laser beam L so as to extend the cracked layer of a given one of the composite layers and to cause the cracked layer to reach the denatured layer of the composite layer which is adjacent to the given one composite layer. The denatured layers and the cracked layers which are sufficient for enabling the wafer to be split are formed by a reduced number of laser beam irradiation operations.

3 Claims, 5 Drawing Sheets

LASER BEAM MACHINING METHOD FOR WAFER

BACKGROUND OF THE INVENTION

1. Field of the Invention

The present invention relates to a laser beam machining method in which a wafer such as a semiconductor wafer is irradiated with a laser beam along each of planned dividing lines formed in the wafer, whereby denatured layers are formed inside the wafer along each of the planned dividing lines.

2. Description of the Related Art

In the semiconductor device chip manufacturing process, planned dividing lines arranged in a grid-like form are formed in a face-side surface of a substantially circular disk-like semiconductor wafer to demarcate a plurality of rectangular regions in the face-side surface, then electronic circuits such as ICs (Integral Circuit) and LSIs (Large Scale Integration) and/or minute electromechanical devices called MEMS (Micro Electro Mechanical System) are formed in the rectangular regions, and thereafter the wafer is cut along the planned dividing lines to obtain semiconductor chips based on the rectangular regions. The thickness of the wafer is generally about 600 to 800 μm, and the wafer may be thinned by grinding the back-side surface thereof, as required. Depending on the use of the semiconductor chips, however, the wafer in the original thickness state may directly be divided, without thinning.

As the means for cutting the wafer, there is generally used a dicing method in which a thin disk-shaped blade being rotated at high speed is caused to cut the wafer. The dicing method has several advantages, one of which is that flat and sharp cut sections can be obtained. In the dicing method, however, the width of the planned dividing lines between the chips has to be not less than a value corresponding to the thickness of the blade used (mainly, about 10 to 30 μm), so that the cutting margin is comparatively large. This is disadvantageous from the viewpoint of increasing the number of chips obtained from a single wafer as much as possible to thereby enhance productivity.

On the other hand, in recent years, a laser beam machining method has come to be adopted in which the inside of a wafer is irradiated with a penetrating laser beam along each of planned dividing lines to form a denatured layer lowered in physical strength, and then an external force is exerted on the wafer to split the wafer along the planned dividing lines, thereby obtaining individual chips. The cutting margin in the laser beam machining method is much smaller than that in the dicing method, and, therefore, the laser beam machining method is said to be advantageous from the viewpoint of productivity. However, in the case of splitting the wafer by the laser beam machining method while the wafer is kept comparatively thick without being thinned, there would be a problem that formation of one denatured layer through one-time irradiation with the laser beam for each of the planned dividing lines may make smooth dividing of the wafer impossible, due to the small proportion of the denatured layer based on the wafer thickness.

In order to solve this problem, there is known a technology in which irradiation with the laser beam is conducted in a plurality of stages to form a plural number of denatured layers for each of the planned dividing lines, thereby ensuring that the splitting of the wafer can be carried out easily and accurately (refer to Japanese Patent Laid-Open No. 2002-205180). In addition, a technology has been proposed in which the wavelength of the laser beam for irradiating the wafer therewith is changed from the conventional value of 1064 nm to a value, promising better penetration into the wafer, of 1100 to 2000 nm (preferably, 1300 to 1600 nm) so as to form the denatured layer efficiently (refer to Japanese Patent Laid-Open No. 2006-108459).

For example, in the case of splitting a wafer with a thickness of 625 μm by irradiating the wafer with a laser beam, the use of a laser beam with the conventional wavelength of 1064 nm results in that a large number of denatured layers, i.e., generally about 18 denatured layers, have to be formed in the thickness direction of the wafer. This means the need to repeat the laser beam irradiation 18 times for each of the planned dividing lines, so that the number of times of irradiation is too large to obtain good machining efficiency. On the other hand, the use of a laser beam with a wavelength of 1342 nm makes it possible to achieve the splitting by forming about eight denatured layers for each of the planned dividing lines, whereby the machining efficiency is improved. However, even by irradiation with the laser beam with a wavelength of 1342 nm, it is in practice difficult to form a multiplicity of denatured layers proximate to each other in the thickness direction of the wafer. It is said that, where a multiplicity of denatured layers are formed, a cracked layer extends from a given one of the denatured layers thus formed toward the adjacent denatured layer to reach the adjacent denatured layer, whereby smooth splitting of the wafer can be realized. Therefore, if the multiplicity of denatured layers cannot be formed closely to each other, the reaching of the cracked layer to the adjacent denatured layer cannot take place easily, so that defective splitting is liable to occur.

The reason for the difficulty in forming the adjacent denatured layers proximately to each other is inferred to reside in that strains or defect layers on a crystal level are formed in the vicinity of the denatured layer once formed and the cracked layer extending from the denatured layer, and, even when that portion is irradiated with a laser beam, good condensing of the laser beam cannot be achieved, so that sufficient multiple photon absorption cannot be attained. Accordingly, in the case of forming a second denatured layer adjacent to a formerly formed first denatured layer, it is necessary to form the second denatured layer at a position somewhat spaced from the cracked layer extending from the first denatured layer, with the result that the cracked layer extending from the first denatured layer does not reach the second denatured layer, and defective splitting is liable to occur.

SUMMARY OF THE INVENTION

Accordingly, it is an object of the present invention to provide a laser beam machining method for a wafer by which a wafer can be split easily and assuredly without lowering the machining efficiency.

In accordance with an aspect of the present invention, there is provided a laser beam machining method for a wafer, including: a wafer holding step of holding a wafer having a first surface and a second surface by sucking the second surface side of the wafer onto a chuck table; a first laser beam irradiation step of setting a focal position of a laser beam at a position inside the wafer and in the vicinity of the second surface, and irradiating the wafer with the laser beam from the first surface side along each of planned dividing lines formed in the wafer so that a composite layer including a denatured layer and a cracked layer extending from the denatured layer toward the first surface is formed inside the wafer; a first laser beam irradiation repeating step of repeating the first laser beam irradiation step a plural number of times while changing the focal position of the laser beam stepwise toward the first surface so that a plurality of the composite layers each including the denatured layer and the cracked layer extending from the denatured layer toward the first surface are formed stepwise at intervals along the thickness direction of the wafer; and a second laser beam irradiation repeating step of irradiating the wafer with a laser beam while adjusting the focal position of the laser beam to a position between the composite layers formed by the first laser beam irradiation repeating step so as to extend the cracked layer of a given one of the composite layers toward the first surface and to cause the cracked layer to reach the denatured layer of the composite layer which is on the first surface side of and adjacent to the given one composite layer.

According to the present invention, the cracked layer is absent in the portions between the composite layers (denatured layer+cracked layer, each) formed inside the wafer by the first laser beam irradiation repeating step, but, due to the influences of crystal defects extending from the cracked layers or the like, multiple photon absorption would not occur and denatured layers would not easily be formed in the portions even upon irradiation with a laser beam. However, the irradiation with a laser beam is expected to have an action of extending the cracked layer extending from the denatured layer which is already present. In the second laser beam irradiation repeating step, the non-cracked layer is irradiated with a laser beam so as to extend the cracked layer to the denatured layer of the adjacent composite layer. This makes it possible to cause the cracked layer of a given composite layer to reach the denatured layer of the adjacent composite layer. Therefore, in splitting the wafer, the splitting can be carried out easily and smoothly, without causing defective splitting. In addition, in the present invention, by carrying out the second laser beam irradiation repeating step, the number of the denatured layers to be formed by the first laser beam irradiation repeating step can be reduced, and the total number of times of irradiation with the laser beam in both of these steps can also be reduced, as compared with the number of times of irradiation with a laser beam for enabling splitting according to the related art. Therefore, machining efficiency can be prevented from being lowered.

Incidentally, in the second laser beam irradiation repeating step, all the non-cracked layers between the composite layers may not necessarily be irradiated with the laser beam, and irradiation of appropriately selected ones of the non-cracked layers is sufficient for enabling the desired splitting. In the case where all the non-cracked layers are thus not irradiated with the laser beam in the second laser beam irradiation repeating step, the machining efficiency can be enhanced further.

In the present invention, the wavelength of the laser beam with which to irradiate the inside of the wafer is preferably set in the range of 1100 to 2000 nm, more preferably 1300 to 1600 nm, from the viewpoint of better penetration of the laser beam into the wafer and a more enhanced machining efficiency.

According to the present invention, irradiation with the laser beam is conducted while adjusting the focal point of the laser beam to a position between the composite layers (denatured layer+cracked layer, each) formed by the first laser beam irradiation repeating step (the second laser beam irradiation repeating step), whereby the cracked layer of a given composite layer can be extended to reach the denatured layer of the adjacent composite layer. Consequently, the wafer can be split easily and assuredly, without lowering the machining efficiency.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
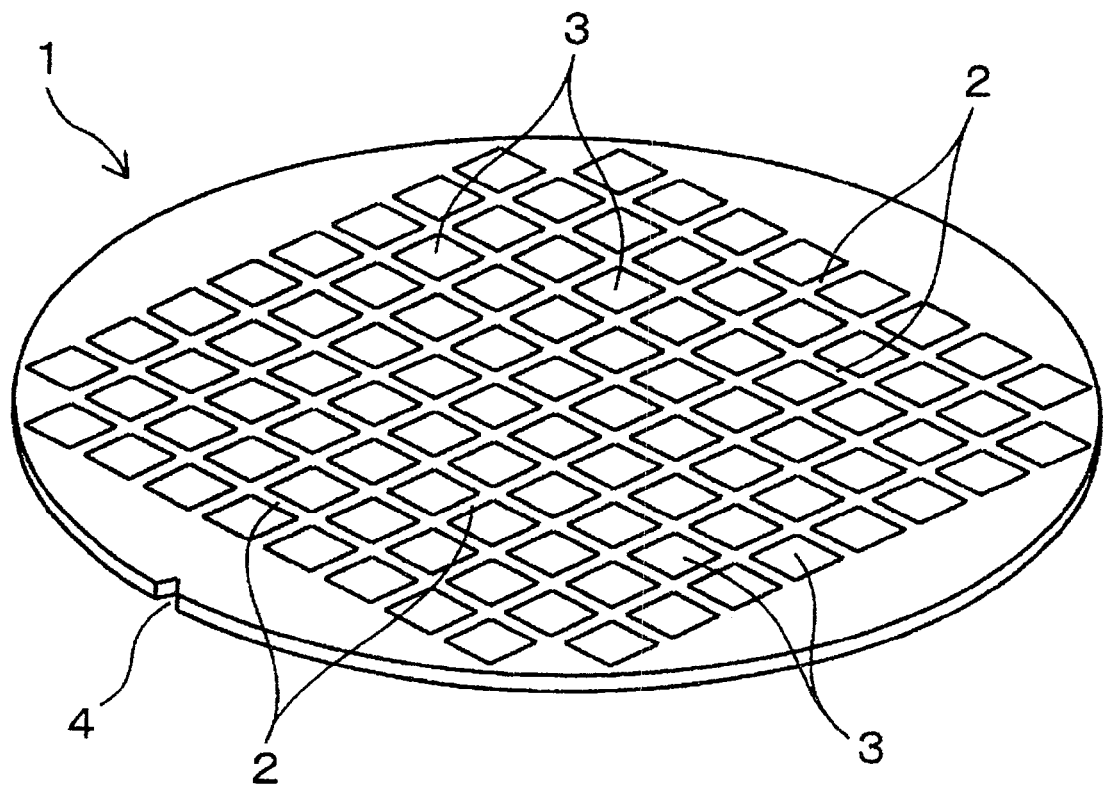
FIG. 1 is a perspective view of a semiconductor wafer to be split into a plurality of individual semiconductor chips by an embodiment of the present invention.

Now, an embodiment of the present invention will be described below, referring to the drawings.

[1] Semiconductor Wafer

Figure 2:
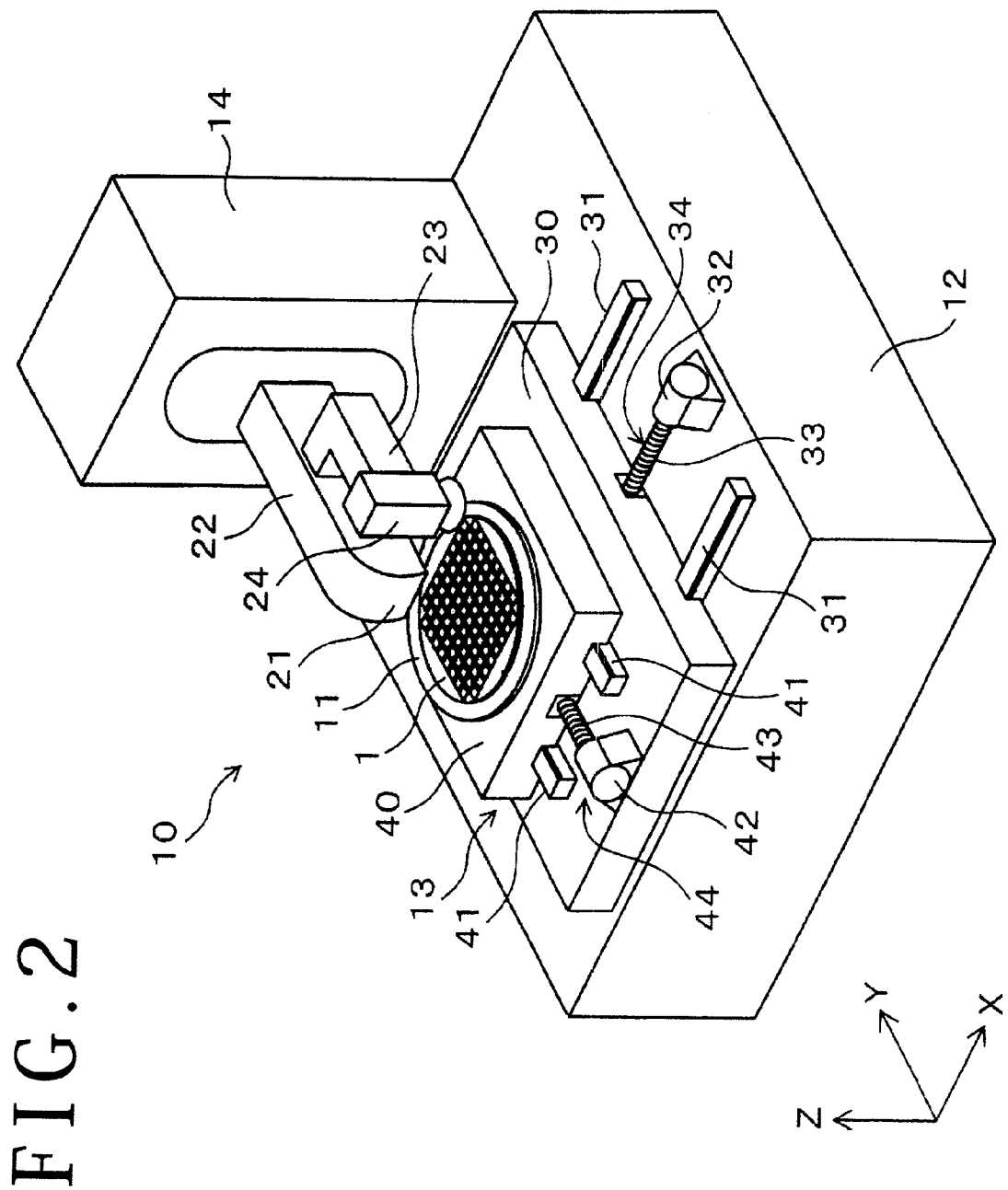
FIG. 2 is a general perspective view of a laser beam machining apparatus with which it is possible to carry out the method according to the embodiment of the present invention.

Symbol 1 in FIG. 1 denotes a circular disk-shaped semiconductor wafer having a comparatively large thickness of about 600 to 800 µm. In a face-side surface of the wafer 1, a plurality of rectangular semiconductor chips (devices) 3 are demarcated by planned dividing lines 2 formed in a grid-like form, and electronic circuits (not shown) such as ICs and LSIs are formed on the face side of the semiconductor chips 3. A circumferential surface of the wafer 1 is provided at a predetermined position thereof with a V-shaped notch 4 indicating the crystal orientation of the semiconductor. By the laser beam machining method according to an embodiment of the present invention, the inside of the wafer 1 is irradiated with a laser beam along the planned dividing lines 2, whereby a denatured layer is formed, and the denatured layer is split, whereby the wafer 1 is split into the individual semiconductor chips 3. The laser beam machining method according to the embodiment is carried out preferably by use of a laser beam machining apparatus shown in FIG. 2.

[2] Formation of Denatured Layer by Laser Beam Machining Apparatus

The above-mentioned wafer 1 is held on a horizontal chuck table 11 possessed by the laser beam machining apparatus 10 in the condition where the face side of the wafer 1 provided with the semiconductor chips 3 is directed upward (wafer holding step). A laser head 21 for radiating a laser beam vertically downwards is disposed on the upper side of the chuck table 11. The chuck table 11 is disposed on an XY moving table 13 provided so as to be movable in an X-axis direction and a Y-axis direction, which are horizontal, on a base 12 of the apparatus 10, and, with the XY moving table 13 moved in the X-axis direction and the Y-axis direction, the planned dividing lines 2 are irradiated with the laser beam radiated from the laser head 21.

The XY moving table 13 includes a combination of an X-axis base 30 provided on the base 12 so as to be movable in the X-axis direction and a Y-axis base 40 provided on the X-axis base 30 so as to be movable in the Y-axis direction. The X-axis base 30 is slidably mounted to a pair of parallel guide rails 31 fixed on the base 12 and extending in the X-axis direction, and is moved in the X-axis direction by an X-axis driving mechanism 34 designed to operate a ball screw 33 by a motor 32. On the other hand, the Y-axis base 40 is slidably mounted to a pair of parallel guide rails 41 fixed on the X-axis base 30 and extending in the Y-axis direction, and is moved in the Y-axis direction by a Y-axis driving mechanism 44 designed to operate a ball screw 43 by a motor 42.

The chuck table 11 is of a generally known vacuum chuck system for holding a work (in this case, the wafer 1) by suction under a vacuum action, is rotatably supported on the Y-axis base 40, and is rotated in one direction or in both directions by a rotational driving mechanism (not shown). The chuck table 11 is moved in the X-axis direction and the Y-axis direction, attendant on the movement of the X-axis base 30 and of the Y-axis base 40.

With the chuck table 11 rotated, the wafer 1 held on the chuck table 11 is so conditioned that the planned dividing lines 2 extending in one direction are set to be parallel to the X-axis direction, whereas the planned dividing lines 2 extending in other direction orthogonal to the one direction are set to be parallel to the Y-axis direction, and this condition is fixed by stopping the chuck table 11. While maintaining this condition, and while moving the X-axis base 30 and the Y-axis base 40 of the XY moving table 13 in an appropriate manner, the inside of the wafer 1 is irradiated from the face side with the laser beam, which is radiated from the laser head 21, along the planned dividing lines 2. In this embodiment, the focal position of the laser beam is set in the inside of the wafer 1, to form a denatured layer at the focal position.

The laser head 21 is provided at the tip of a casing 22 extending in the Y-axis direction toward a position on the upper side of the chuck table 11. The casing 22 is provided on a column 14, which is erectly provided on the upper surface of the base 12, so that it can be moved up and down along the vertical direction (Z-axis direction), and it is moved up and down by an up/down driving mechanism (not shown) contained in the column 14.

A pulsed laser oscillator composed of a YAG (Yttrium Aluminum Garnet) laser oscillator or a YVO4 (Yttrium Vanadate) laser oscillator is connected to the laser head 21, and laser light oscillated by the laser oscillator is radiated vertically downwards from the laser head 12 as a laser beam. The laser light oscillated by the laser oscillator is of such a kind as to be good in ability to penetrate into the wafer 1 to securely form a denatured or degenerated layer, thereby facilitating splitting of the wafer 1. For example, a laser having an output of 1 to 5 W, and a wavelength of 1100 to 2000 nm, preferably 1300 to 1600 nm, is preferably used.

The position of irradiation with the laser beam from the laser head 21 is controlled based on an image picked up by a microscope 24 which is attached to one side of the casing 22 through an arm 23. The microscope 24 is moved vertically together with the laser head 21 attendantly on the vertical movement of the casing 22, to thereby adjust the focus. Before irradiated with the laser beam, the wafer 1 held on the chuck table 11 is moved to the position under the microscope 24, where the pattern image of the surface of the wafer 1 is picked up by the microscope 24. The pattern image of the wafer surface thus picked up is taken into an image processing means (not shown), which detects the planned dividing line 2 to be cut. Further, based on the data on the planned dividing line 2 detected by the image processing means, such operations as the operations of moving the chuck table 11 and the XY moving table 13 and the operation of radiating the laser beam from the laser head 21 are controlled. Incidentally, use of an IR (infrared) microscope as the microscope 24 makes it possible to recognize the planned dividing line 2 through a process in which the wafer 1 is held on the chuck table 11 with its back side exposed, and the pattern image of the face-side surface of the wafer 1 in this condition is picked up by the microscope 24 on the back side of the wafer 1 in the manner of transmitting through the inside of the wafer 1. This ensures that the wafer 1 can be irradiated with the laser light from the back side thereof.

In the laser beam machining apparatus 10, by irradiating the planned dividing line 2 with the laser beam from the laser head 21 while moving the X-axis base 30 in the X-axis direction, a denatured layer is formed inside the wafer 1 along the planned dividing line 2 parallel to the X-axis direction. In addition, by irradiating the planned dividing line 2 with the laser beam from the laser head 21 while moving the Y-axis base 40 in the Y-axis direction, a denatured layer is formed inside the wafer 1 along the planned dividing line 2 parallel to the Y-axis direction. In irradiating with the laser beam, in order to form the denatured layer by adjusting the focal position of the laser beam to a position in the inside of the wafer 1, the vertical position of the laser head 21 is adjusted by vertically moving the casing 22, whereby the focal position of the laser beam is set to the desired height inside the wafer 1.

Figure 3:
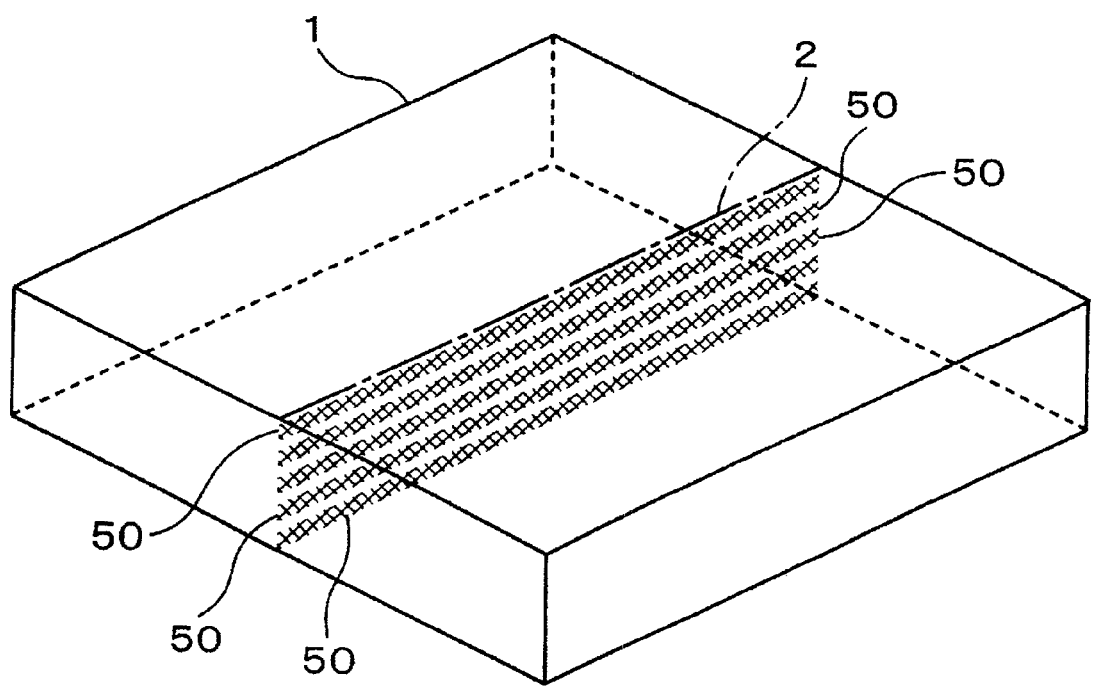
FIG. 3 is a perspective drawing showing schematically the condition where a plurality of denatured layers are formed inside a wafer, along a planned dividing line.

In the above-mentioned manner, the irradiation with the laser beam is conducted along all the planned dividing lines 2 parallel to the X-axis direction and those parallel to the Y-axis direction to thereby form the denatured layers inside the wafer 1. In this embodiment, the laser beam irradiation operation for each of the planned dividing lines 2 is conducted a plural number of times, and every time the operation is repeated, the focal position of the laser beam is changed stepwise from that portion of the wafer 1 which is in the vicinity of the back-side surface proximate to the chuck table 11 toward the face side, whereby a plurality of the denatured layers 50 are formed as shown in FIG. 3 (first laser beam irradiation step). After this step, further, some of the portions between the denatured layers 50 are irradiated with the laser beam (second laser beam irradiation step). Now, these steps will be described in detail below.

[2-1] First Laser Beam Irradiation Step

Figure 4A:
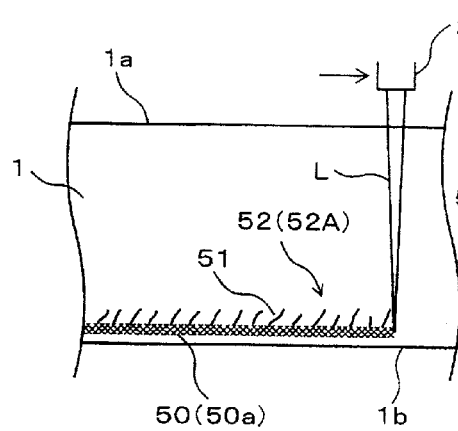
FIGS. 4A to 4D are enlarged sectional views for illustrating the laser beam machining method according to the present invention.

As shown in FIG. 4A, the focal position of the laser beam L is adjusted to that position inside the wafer 1 which corresponds to one planned dividing line 2 and which is located at a height proximate to the back-side surface 1b, and the irradiation with the laser beam L is conducted horizontally along the planned dividing line 2, to form the denatured layer 50 (first denatured layer 50a). As the denatured layer 50a is formed, a cracked layer 51 including a multiplicity of cracks extending from the denatured layer 50a toward the face side on the upper side is formed. Here, the first denatured layer 50a and the cracked layer 51 derived from the first denatured layer 50a are altogether referred to as a composite layer (first composite layer 52A) 52.

Figure 4B:
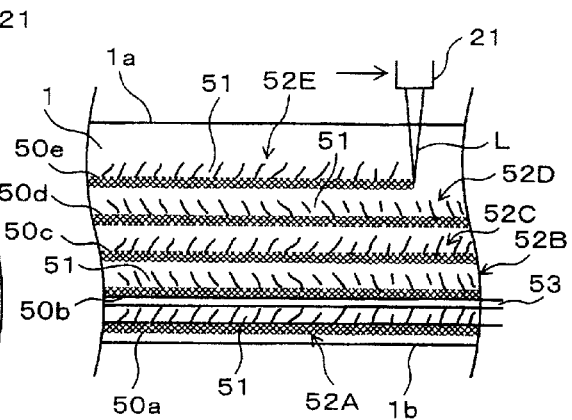

Next, as shown in FIG. 4B, the irradiation with the laser beam L is repeated stepwise at intervals along the direction toward the upper side (the side of the face-side surface 1a of the wafer 1) of the first composite layer 52A, to form a plurality of composite layers 52. In this case, five composite layers 52 (first to fifth composite layers 52A, 52B, 52C, 52D, and 52E) are formed, and the composite layers 52 (52A to 52E) include the first to fifth denatured layers 50a, 50b, 50c, 50d, and 50e and the cracked layers 51 derived therefrom, respectively. In addition, the intervals between the composite layers 52 are even, and the intervals are secured without fail;

for this purpose, the interval of the laser beam focal positions in the thickness direction of the wafer 1 is set to about 20 μm, for example. The focal position of the laser beam with which to irradiate a wafer inside portion just above the composite layer 52 in the first laser beam irradiation step is set on the upper side relative to the cracked layer 51 of the underlying composite layer 52, so that a non-cracked layer 53 where the cracked layer 51 is absent is secured between the adjacent composite layers 52. Incidentally, the composite layers 52 are not formed throughout the thickness of the wafer 1, and a predetermined interval is left between the composite layer 52 on the most face side and the face-side surface 1a. This is for preventing the semiconductor chips 3 formed at the face-side surface 1a from being damaged by the laser beam.

Figure 4C:
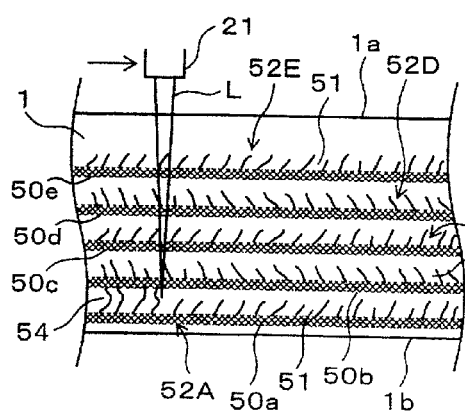
Figure 4D:
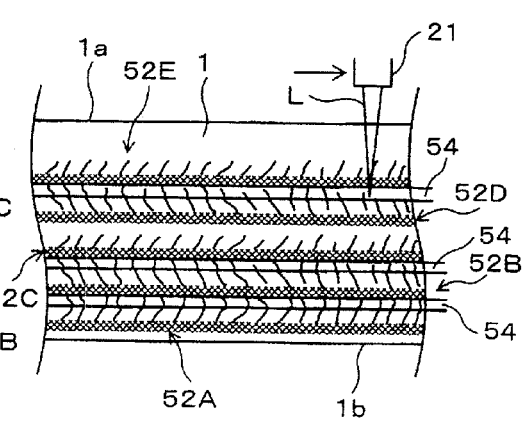

[2-2] Second Laser Beam Irradiation Step As shown in FIG. 4C, the irradiation is conducted by adjusting the focal position of the laser beam L to the non-cracked layer 53 present between the composite layer 52A the closest to the back-side surface 1b of the wafer 1 and the composite layer 52B just on the upper side of the composite layer 52A. This causes the cracked layer 51 formed at the time of forming the denatured layer 50a to extend upwards, and the thus extending cracked layer 54 eventually reaches the denatured layer 50b just on the upper side. The irradiation of the non-cracked layer 53 with the laser beam L in this manner is repeated for the non-cracked layers 53 between the composite layers 52, as shown in FIG. 4D. In the case of the figure, the non-cracked layer 53 between the composite layers 52C and 52D is not shown as irradiated with the laser beam, but all the non-cracked layers 53 between the composite layers 52 may be irradiated with the laser beam.

In this manner, a plurality of the composite layers 52 are formed along each of the planned dividing lines 2, and the non-cracked layers 53 between the composite layers 52 are appropriately irradiated with the laser beam L, to cause the cracked layer 51 of a given composite layer 52 to extend to the denatured layer 50 of the adjacent composite layer 52, whereby the subsequent wafer splitting operation can be carried out easily and securely. For example, a wafer having a diameter of 150 mm, a thickness of about 400 μm and a size of the semiconductor chip 3 of about 1.5 mm is subjected to the first and second laser beam irradiation steps in the same manner as above-mentioned, to form five composite layers 52 and three extended cracked layers 54, whereby splitting of the wafer is facilitated. The laser beam irradiation conditions in this case are a laser beam wavelength of the pulsed laser of 1342 nm, a repetition frequency of 150 kHz, an NA (numerical aperture) of a laser beam condenser lens of 0.8, and a moving speed (the speed of machining feed by the XY moving table 13) of the chuck table 11 of 300 mm/sec.

While the irradiation of the non-cracked layer 53 with the laser beam may be conducted only once, this irradiation may be repeated a plural number of times through reciprocating motion of the XY moving table 13. In addition, the wavelength of the laser beam for forming the denatured layer 50 in the first laser beam irradiation step and the wavelength of the laser beam with which to irradiate the non-cracked layer 53 in the second laser beam irradiation step may be the same or different. Especially, the laser beam for forming the denatured layer 50 is preferably a pulsed laser, whereas the laser beam for irradiating the non-cracked layer 53 therewith may be a pulsed laser or may be a CW (Continuous Wave) laser. Further, the NA (numerical aperture) of the condenser lens for the laser beam with which to irradiate the non-cracked layer 53 is preferably equal to or smaller than that for the laser beam for forming the denatured layer 50.

After the plurality of composite layers (denatured layer 50+cracked layer 51, each) 52 are formed along each of all the planned dividing lines 2 extending in the X-axis direction and the Y-axis direction and then all of or appropriately selected ones of the non-cracked layers 53 between the composite layers 52 are irradiated with the laser beam L to form the extended cracked layers 54, the wafer 1 is detached from the chuck table 11 and the subsequent wafer splitting step is started.

Figure 5:
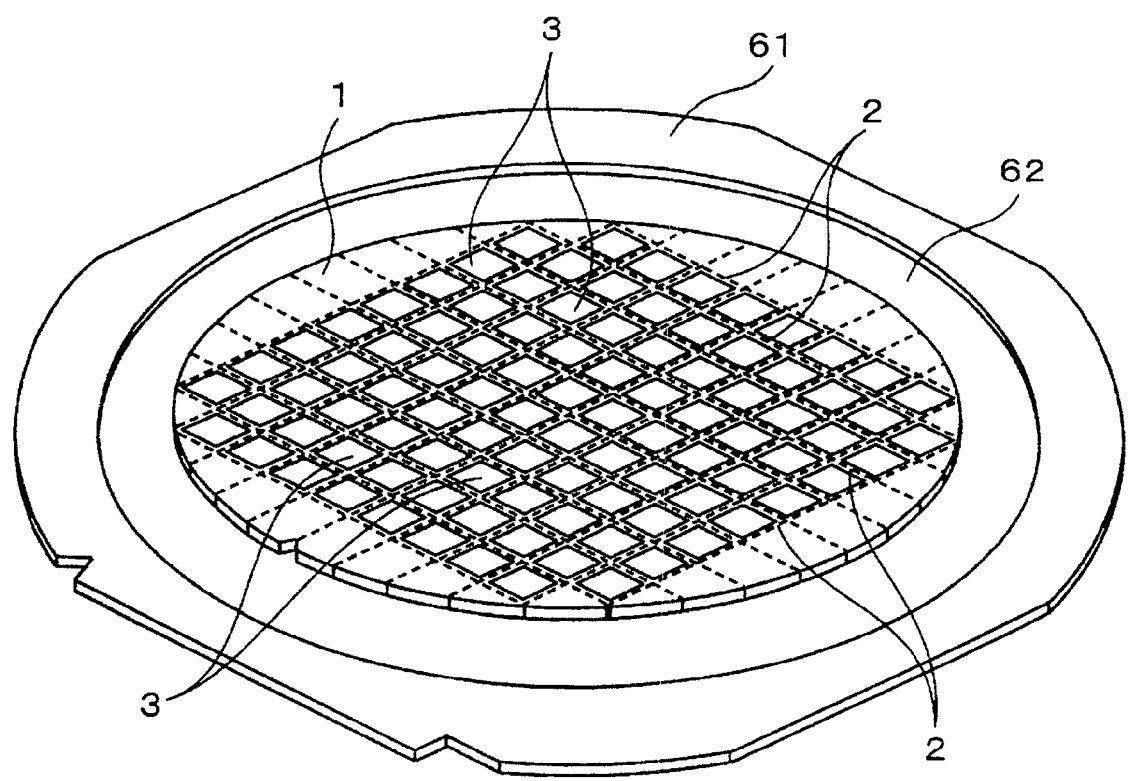
FIG. 5 is a perspective view showing the condition where the wafer irradiated with a laser beam along the planned dividing lines is adhered to a dicing tape for splitting the wafer.

For splitting the wafer 1, as shown in FIG. 5, the back side of the wafer 1 is adhered to a dicing tape 62 to the periphery of which a dicing frame 61 has been adhered. The broken lines in the figure denote the planned dividing lines 2 along which the composite layers (denatured layer 50+cracked layer 51, each) 52 and the extended cracked layers 54 are formed inside the wafer 1. The wafer 1 is set onto an external force exerting apparatus such as a breaking apparatus through the dicing tape 62 and the dicing frame 61, and an external force such as a tension is exerted on the dicing tape 62, whereby the wafer 1 is split along the planned dividing lines 2, into individual semiconductor chips 3.

[3] Effects of the Embodiment

According to the above-described embodiment, the non-cracked layers 53 where the cracked layer is absent are provided between the plurality of composite layers (denatured layer 50+cracked layer 51, each) 52 formed inside the wafer 1 by the first laser beam irradiation step, and, due to the influences of crystal defects extending from the cracked layers 51 or the like, multiple photon absorption would not take place and denatured layers would not easily be formed in these non-cracked layer portions even upon irradiation thereof with the laser beam. However, the irradiation with the laser beam is expected to have the action of extending those cracked layers 51 extending from the denatured layers 50 which have already been present. In the second laser beam irradiation step, the non-cracked layer 53 is irradiated with the laser beam, whereby the cracked layer 51 of a given composite layer 52 is extended to the denatured layer 50 of the adjacent composite layer 52. This ensures that some of the cracked layers 51 formed in the first laser beam irradiation step are caused to reach the denatured layers 50 of the adjacent composite layers 52, so that splitting of the wafer 1 can be carried out easily and smoothly, without causing defective splitting.

In addition, by performing the second laser beam irradiation step, the number of the denatured layers 50 to be formed by the first laser beam irradiation step can be reduced, and the total number of times of irradiation with the laser beam in both the steps can also be reduced, as compared with the number of times of irradiation with the laser beam for enabling the splitting according to the related art. Therefore, it is also possible to prevent the machining efficiency from being lowered. Furthermore, all the non-cracked layers 53 between the composite layers 52 may not necessarily be irradiated with the laser beam, and irradiation of only appropriately selected ones of the non-cracked layers 53 with the laser beam may suffice for splitting of the wafer 1. In the case where all the non-cracked layers 53 are thus not irradiated with the laser beam in the second laser beam irradiation step, the machining efficiency can be enhanced more.

Now, the effects of the present invention will be verified by describing working examples of the present invention. Incidentally, ten wafer samples were prepared in each of Examples and Comparative Examples described below.

EXAMPLE 1

A silicon wafer at a blank material stage having a diameter of 150 mm and a thickness of 400 μm was prepared as a sample. The wafer is a so-called "mirror wafer," i.e., a wafer not provided on its face-side surface with a device pattern which might be obtained by providing electronic circuits in chip regions demarcated by grid-like planned dividing lines. The wafer was set on a chuck table of a laser beam machining apparatus the same as that shown in FIG. 2, with its face side up. The wafer was provided with virtual planned dividing lines at intervals of 1.5 mm, and, along all the virtual planned dividing lines, five composite layers (denatured layer+ cracked layer, each) were formed stepwise at intervals of 20 μm, starting from a wafer inside position proximate to the back-side surface of the wafer. Next, three of the four non-cracked layers between the composite layers were subjected to irradiation with the laser beam, to form extended cracked layers. In other words, the laser beam irradiation operation was conducted eight times along each of the planned dividing lines. Incidentally, the laser beam was a pulsed laser beam, and the irradiation conditions were set as follows.

Light source . . . LD excited Q switch Nd: YVO4 laser
Wavelength . . . 1342 nm
Repetition frequency . . . 150 kHz
Output . . . Output 1.2 W (0.6 W in forming the composite layer nearest to face)
NA (numerical aperture) of laser beam condenser lens . . . 0.8
Moving speed (machining feed rate) of chuck table . . . 300 mm/sec
Pulse width . . . 105 ns
Condensed spot diameter . . . φ1.5 μm

EXAMPLE 2

A mirror wafer substantially the same as that in Example 1 was actually provided in its face-side surface with grid-like planned dividing lines at intervals of 1.5 mm, and suitable electronic circuits were formed in chip regions demarcated by the planned dividing lines, whereby a "pattern wafer" provided with device patterns were prepared as a sample. The wafer was irradiated with a laser beam in quite the same manner as in Example 1, whereby five composite layers (denatured layer+cracked layer, each) plus three extended cracked layers were formed inside the wafer along each of the planned dividing lines.

COMPARATIVE EXAMPLE 1

A mirror wafer substantially the same as that in Example 1 was irradiated with a laser beam in the same conditions as in Example 1, except that the output of the laser beam for forming the composite layers was 0.8 W (0.5 W at the time of forming the composite layer nearest to the face-side surface), the number of the composite layers was eight, and the portions between the composite layers were not irradiated with the laser beam. In this way, only eight composite layers were formed inside the wafer along each of the planned dividing lines.

COMPARATIVE EXAMPLE 2

A pattern wafer substantially the same as that in Example 2 was irradiated with a laser beam in quite the same conditions as in Comparative Example 1, whereby only eight composite layers were formed inside the wafer along each of the planned dividing lines.

COMPARATIVE EXAMPLE 3

A mirror wafer substantially the same as that in Example 1 was irradiated with a laser beam in the same conditions as in Example 1, except that the output of the laser beam for forming the composite layers was 1.2 W (0.6 W at the time of forming the composite layer nearest to the face-side surface), the number of the composite layers formed was five, and the portions between the composite layers were not irradiated with the laser beam. In this manner, only five composite layers were formed inside the wafer along each of the planned dividing lines.

COMPARATIVE EXAMPLE 4

A pattern wafer substantially the same as that in Example 2 was irradiated with a laser beam in quite the same conditions as in Comparative Example 3, whereby only five composite layers were formed inside the wafer along each of the planned dividing lines.

[Splitting Test]

Each of the ten wafers each obtained in Examples 1 and 2 and Comparative Examples 1 to 4 was adhered to a dicing tape as shown in FIG. 5, the assembly was set on a breaking apparatus, and an external force was exerted thereon in an attempt to split the wafer. The results of the splitting were as follows. Incidentally, the splitting ratio has a value of 100% when all the semiconductor chips formed on a single wafer are individually obtained upon splitting of the wafer. Besides, the results of observation of the split sections are also given below.

Splitting Ratio
Example 1 (Mirror wafer) . . . Splitting ratio: 100%
Example 2 (Pattern wafer) . . . Splitting ratio: 100%
Comparative Example 1 (Mirror Wafer) . . . Splitting ratio: 90%
Comparative Example 2 (Pattern wafer) Splitting not done
Comparative Example 3 (Mirror wafer) . . . Splitting ratio: 100%
Comparative Example 4 (Pattern wafer) . . . About 2% of non-split lines left in two or three out of ten wafers State of Split Sections The 5-denatured-layer wafers prepared in Examples 1 and 2 and Comparative Examples 3 and 4 showed substantially the same split sections, in which an alternative striped pattern of denatured layers and crystalline layers (non-cracked layers) was clearly observed. This is considered to be due to the comparatively small number of the denatured layers in relation to the wafer thickness and due also to the large interval between the denatured layers. On the other hand, the 8-denatured-layer wafers prepared in Comparative Examples 1 and 2 had an appearance in which the adjacent denatured layers were so close to each other as to appear almost continuous, since the number of the denatured layers was large.

According to the above results, it is seen that Examples 1 and 2 based on the present invention yielded good results with a splitting ratio of 100%. On the other hand, Comparative Examples 3 and 4, in which the irradiation of the portions between the denatured layers with the laser beam conducted in Examples 1 and 2 was omitted, gave a splitting ratio of 100% for the mirror wafer being comparatively easily splittable (Comparative Example 3) but could not give a splitting ratio of 100% for the pattern wafer being hardly splittable (Comparative Example 4). This verifies the effect of the present invention in which the non-cracked layer between the denatured layers is irradiated with the laser beam to extend the cracked layer to the denatured layer. Besides, in Comparative Examples 1 and 2, the mirror wafer gave a splitting ratio of 90%; thus, there was recognized a lowering in the splitting ratio due to the comparatively dense (close) arrangement of the denatured layers. Incidentally, the pattern wafer of Comparative Example 2 is a wafer which is less easily splittable than the mirror wafer, and cannot be expected to show a splitting ratio of more than 90%; in view of this, splitting was not conducted for the pattern wafer of Comparative Example 2.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser beam machining method for a wafer, comprising:
    a wafer holding step of holding a wafer having a first surface and a second surface by sucking the second surface side of said wafer onto a chuck table;
    a first laser beam irradiation step of setting a focal position of a laser beam at a position inside said wafer and in the vicinity of said second surface, and irradiating said wafer with said laser beam from said first surface side along each of planned dividing lines formed in said wafer so that a composite layer including a denatured layer and a cracked layer extending from said denatured layer toward said first surface is formed inside said wafer;
    a first laser beam irradiation repeating step of repeating said first laser beam irradiation step a plural number of times while changing said focal position of said laser beam stepwise toward said first surface so that a plurality of said composite layers each including said denatured layer and said cracked layer extending from said denatured layer toward said first surface are formed stepwise at intervals along the thickness direction of said wafer; and
    a second laser beam irradiation repeating step of irradiating said wafer with a laser beam while adjusting the focal position of said laser beam to a position between said composite layers formed by said first laser beam irradiation repeating step so as to extend said cracked layer of a given one of said composite layers toward said first surface and to cause said cracked layer to reach said denatured layer of said composite layer which is on said first surface side of and adjacent to said given one composite layer.

2. The laser beam machining method for the wafer as set forth in claim 1, further comprising a wafer splitting step of splitting said wafer along said planned dividing lines by exerting an external force on said wafer.

3. The laser beam machining method for the wafer as set forth in claim 1, wherein the wavelength of said laser beam is set in the range of 1100 to 2000 nm.

* * * * *